United States Patent [19]
Aikawa et al.

[11] Patent Number: 6,125,065
[45] Date of Patent: Sep. 26, 2000

[54] SEMICONDUCTOR MEMORY WITH COLUMN GATES AND METHOD OF CONTROLLING COLUMN GATES DURING A WRITE MASK OPERATION

[75] Inventors: Tadao Aikawa; Yasuharu Sato; Hiroyuki Kobayashi; Hitoshi Ikeda, all of Kawasaki, Japan

[73] Assignee: Fujitsu Limited, Kanagawa, Japan

[21] Appl. No.: 09/274,251

[22] Filed: Mar. 23, 1999

[30] Foreign Application Priority Data

Sep. 9, 1998 [JP] Japan .................................. 10-255175

[51] Int. Cl.⁷ ...................................................... G11C 7/00
[52] U.S. Cl. .................... 365/195; 365/230.06; 365/190; 365/233; 365/189.05
[58] Field of Search ..................................... 365/195, 196, 365/230.06, 190, 233, 230.08, 189.05

[56] References Cited

U.S. PATENT DOCUMENTS 5,321,651  6/1994  Monk .................................. 365/189.01
5,907,512  5/1999  Parkinson et al. ....................... 365/195

*Primary Examiner*—Andrew Q. Tran
*Attorney, Agent, or Firm*—Arent Fox Kintner Plotkin & Kahn PLLC

[57] ABSTRACT

A semiconductor memory has pairs of bit lines connected to its memory cells. Sense amps are connected across the bit line pairs. Column gate pairs are connected to the bit line pairs, and data bus pairs are connected to the bit line pairs via the column gate pairs. A column gate drive control circuit is connected to the column gate pairs and turns selected column gate pairs off during a write mask operation.

14 Claims, 4 Drawing Sheets

SEMICONDUCTOR MEMORY WITH COLUMN GATES AND METHOD OF CONTROLLING COLUMN GATES DURING A WRITE MASK OPERATION

BACKGROUND OF THE INVENTION

The invention relates to a semiconductor memory with column gates, and more particularly, to a semiconductor memory with a write mask function and a method of controlling a column gate during a write mask operation.

Address multiplexing is used to read and write data from or to a conventional dynamic random access memory (DRAM). The address multiplexing uses a row address strobe (RAS) signal, a column address strobe (CAS) signal and an address including row and column addresses. The DRAM includes a RAS and a CAS circuit. The RAS circuit is activated upon receiving a row address in accordance with the RAS signal, while the CAS circuit is activated upon receiving a column address in accordance with the CAS signal. When the RAS circuit is activated, a sense-amp becomes operative and remains operative until it receives a precharge command.

Referring to FIG. 1, a first example of a conventional DRAM 200 will be described. The DRAM 200 comprises a plurality of memory cells 110 (only one is shown), a plurality word lines WL, a plurality of bit line pairs BL, /BL, a sense-amp 100, column gates 101, 102 and a write amp 112. Each memory cell 110 is connected to one of the plurality of word lines WL and either one of the plurality of bit line pairs BL, /BL. The column gates 101, 102 each comprise an N-channel MOS transistor connected to the bit line BL or /BL. Each of the column gates 101, 102 has a gate which receives a column select signal CL. The bit lines BL, /BL are connected via the column gates 101, 102 to data buses DB, /DB. Both RAS and CAS circuits, not shown, are connected to the word line WL and the column select signal CL. The write-amp 112 is connected to the data buses DB, /DB.

The sense-amp 100 is connected across the bit lines BL, /BL and amplifies a potential difference thereacross when activated. The sense-amp 100 comprises P-channel MOS transistors Tr1, Tr3 and N-channel MOS transistors Tr2, Tr4. The transistors Tr1, Tr3 have their sources connected to an activation source $V_{SAH}$, and transistors Tr2, Tr4 have their sources connected to an activation source $V_{SAL}$. When the activation source $V_{SAH}$ assumes a high level and the activation source $V_{SAL}$ assumes a low level, the sense-amp 100 is activated. In contrast, when both of the sources $V_{SAH}$ and $V_{SAL}$ assume the same level, the sense-amp 100 is deactivated.

When reading data from the memory cell 110, the RAS circuit is initially activated, and a particular word line WL is selected. Data from the memory cell 110 connected to the word line WL is read onto the bit lines BL, /BL, and is then amplified by the sense-amp 100. Then follows the activation of the CAS circuit, which turns on the column gates 101, 102 connected via the column select signal CL. In response thereto, the bit lines BL, /BL are connected to the data buses DB, /DB, respectively, thus providing data on the bit lines BL, /BL to the data buses DB, /DB, respectively. When the column gates 101, 102 are turned on, a load on the sense-amp 100 increases. This load variation disturbs the data on the bit line BL, as indicated by phantom lines in FIG. 2. The disturbance disappears in response to the falling edge of the column select signal CL which turns off the column gates 101, 102. Subsequently, the sense-amp 100 is precharged in response to a precharge command. Because the precharge takes place after the disappearance of the disturbances, the occurrence of disturbances presents no problem to the data read operation.

During a write operation, the word line WL is selected before the column gates 101, 102 are turned on. The write-amp 112 feeds data to be written via the data buses DB, /DB and the column gates 101, 102 onto the bit lines BL, /BL, and into the memory cell 110. If disturbances to the data on the bit lines BL, /BL now occur, the strong drive of the data to be written by the write-amp 112 avoids any problem associated with the occurrence of disturbances.

Referring to FIG. 3, a second example of a conventional DRAM 210 which is a direct sensing type will be described. The direct sensing type DRAM 210 uses a technique of rapidly delivering data from a sense-amp to a peripheral circuit. In addition to the components shown in FIG. 1 for the DRAM 200, the DRAM 210 includes write column gates 103, 104, read data detecting NMOS transistors 105, 106 and a control transistor 107.

The column gates 103, 104 are each formed by N-channel MOS transistors connected in series with the column gates 101, 102, respectively. The column gate transistors 103, 104 have respective gates which are connected to a write column line WCL. NMOS transistors 105, 106 have gates which are connected to the bit lines BL, /BL, respectively. The MOS transistor 105 has a drain connected to the data bus /DB and a source connected to the N-channel MOS transistor 107. The MOS transistor 106 has a drain connected to the data bus DB and a source connected to the NMOS transistor 107. The column gates 101, 102 and the MOS transistor 107 receive a column select signal CL0 at their respective gates.

During a read operation, the MOS transistors 105, 106 detect the levels of the bit lines BL, /BL, respectively, when the column gates 101, 102 and the MOS transistor 107 are turned on. When the bit line BL assumes an H level and the bit line /BL assumes an L level, the MOS transistor 105 is turned on and the MOS transistor 106 is turned off. In response to the turn-on of the MOS transistor 105, an L level is set on the data bus /DB, and in response to the turn-off of the MOS transistor 106, an H level is set up on the data bus DB. In this manner, data on the bit lines BL, /BL are read on the data buses DB, /DB.

During a write operation, the column gates 101, 102 and the write column gates 103, 104 are turned on. The write-amp 112 amplifies data to be written and transmits it to the data buses DB, /DB. The amplified data are fed via the column gates 101, 102 and the write column gates 103, 104 to the bit lines BL, /BL to be written into a selected memory cell 110.

The DRAM 210 also performs a write mask operation, which is a type of write operation. A write mask operation enables a write operation only to a desired bit line or lines. In other words, during the write mask operation, a certain bit line or lines to which no data write operation should take place are masked to prevent a write operation thereto.

Specifically, during the write mask operation, both of the data buses DB, /DB are held at an H level, thus inhibiting the operation of the write-amp 112. Under this condition, the column gates 101, 102 and the write column gates 103, 104 are turned on to establish a connection between the data buses DB, /DB and the bit lines BL, /BL. At this time, the sense-amp 100 amplifies data from the memory cell 110 which is selected by the word line WL and rewrites this data into the memory cell 110, without being influenced by the data from the data buses DB, /DB. The data write operation is inhibited in this manner by disabling the operation of the write-amp 112.

A DRAM drive technique has been proposed in which a command and an address are collectively received as an input and a single command covers an active phase to a precharge phase of a sense-amp. This technique is particularly preferred for use in a read operation of a direct sensing type DRAM.

During a read operation, the sense-amp 100 passes data on the bit lines BL, /BL to the data buses DB, /DB via the MOS transistors 105, 106, and accordingly, there is no variation in the load on the sense-amp 100. Consequently, as illustrated in FIG. 4, there is no disturbance to the data on the bit lines BL, /BL. This allows the sense-amp 100 to be transferred from the active condition to the precharge operation anytime.

However, during a write operation, the load on the sense-amp 100 increases in response to the turn-on of the column gates 101 to 104. As a consequence, the data which is passed from the data buses DB, /DB to the bit lines BL, /BL is subject to disturbances as shown in phantom lines in FIG. 4. These disturbances are of no particular consequence for the normal write operation, since at that time a strong drive is provided to the data on the bit lines BL, /BL by the write-amp 112. Specifically, the write-amp 112 operates to increase the difference between the data levels on the bit lines BL, /BL, eliminating any adverse influence of disturbances.

However, the load variation causes a problem during the write mask operation. A load on the sense-amp 100 increases in response to the turning-on the column gates 101 to 104 during the write mask operation as well as above write mode. And the disturbance on the bit line BL occurs. In the write mask operation, the write-amp 112 does not operate, therefore, the sense-amp 100 amplifies the voltage between the bit line pair BL, /BL, to remove the disturbance. However, a drive ability of the sense-amp 100 is smaller than that of the write-amp, therefore, it takes a relatively long time to remove the disturbance. In addition, in new types of devices, such as First Cycle RAM (FCRAM), an active period of sense-amp is shorter than conventional type memory devices.

If the sense-amp 100 completes its rewriting into the memory cell 110 and enters the precharge operation before the disturbance is removed (FIG. 4), a malfunction is caused. In other words, a write into the memory cell 110 takes place before the ground level has not been recovered on the bit line BL.

It is an object of the invention to provide a semiconductor memory which accurately executes a write mask operation.

SUMMARY OF THE INVENTION

To achieve the above objective, the present invention provides a semiconductor memory comprising: a plurality of memory cells; a bit line pair connected to memory cells; a column gate pair connected; a data bus pair connected to the bit line pair via said column gate pair; and a column gate drive control circuit receiving a write mask signal and outputting a gate control signal to the column gate pair, the column gate drive control circuit turning the column gate pair off in response to a write mask signal.

The present invention further provides a method of controlling a semiconductor memory including a plurality of memory cells, a bit line pair connected to the memory cells, a data bus pair, and a column gate pair connected between the bit line pair and the data bus pair, the method comprising the steps of: detecting a write mask operation; and turning the column gate pair off during the write mask operation.

The present invention provides a method of writing data to a semiconductor memory, comprising the steps of: selecting a word line; masking a specific one of a plurality of memory cells connected to the word line; disconnecting a bit line from a gate line connected to the masked memory cell; and writing data into memory cells which are not masked.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
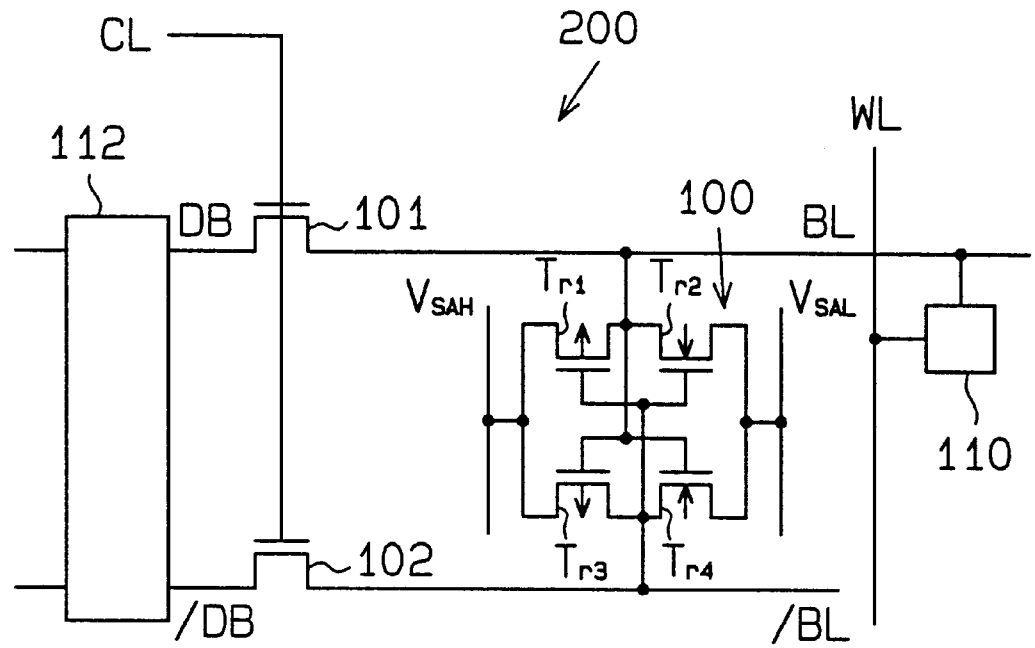
FIG. 1 is a circuit diagram of a first example of a conventional DRAM.
Figure 2:
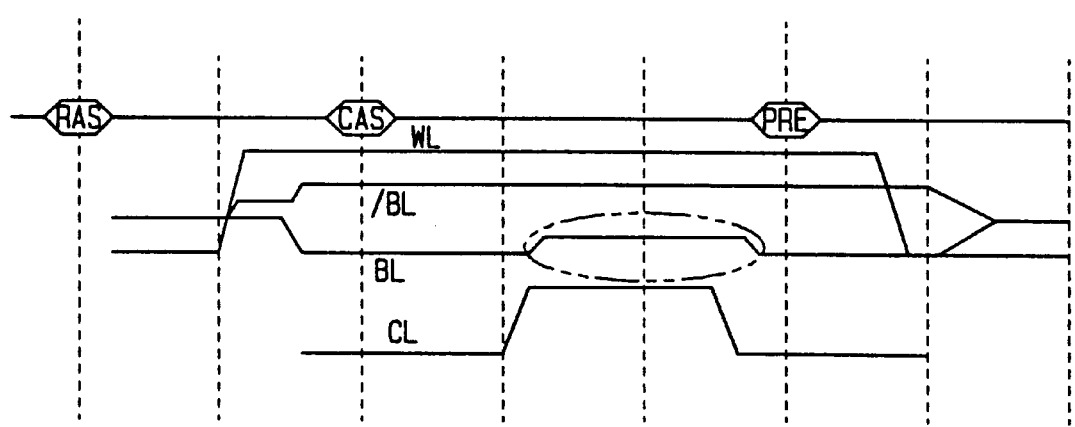
FIG. 2 is a timing chart of various signals appearing in the DRAM of FIG. 1.

In the drawings, like numerals are used for like elements throughout.

Figure 3:
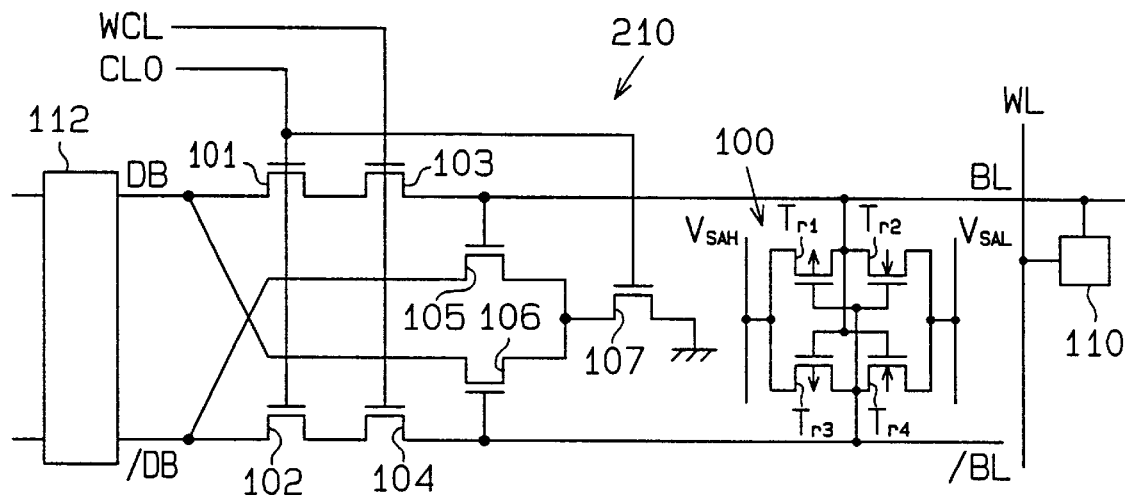
FIG. 3 is a circuit diagram of a second example of a conventional DRAM.
Figure 4:
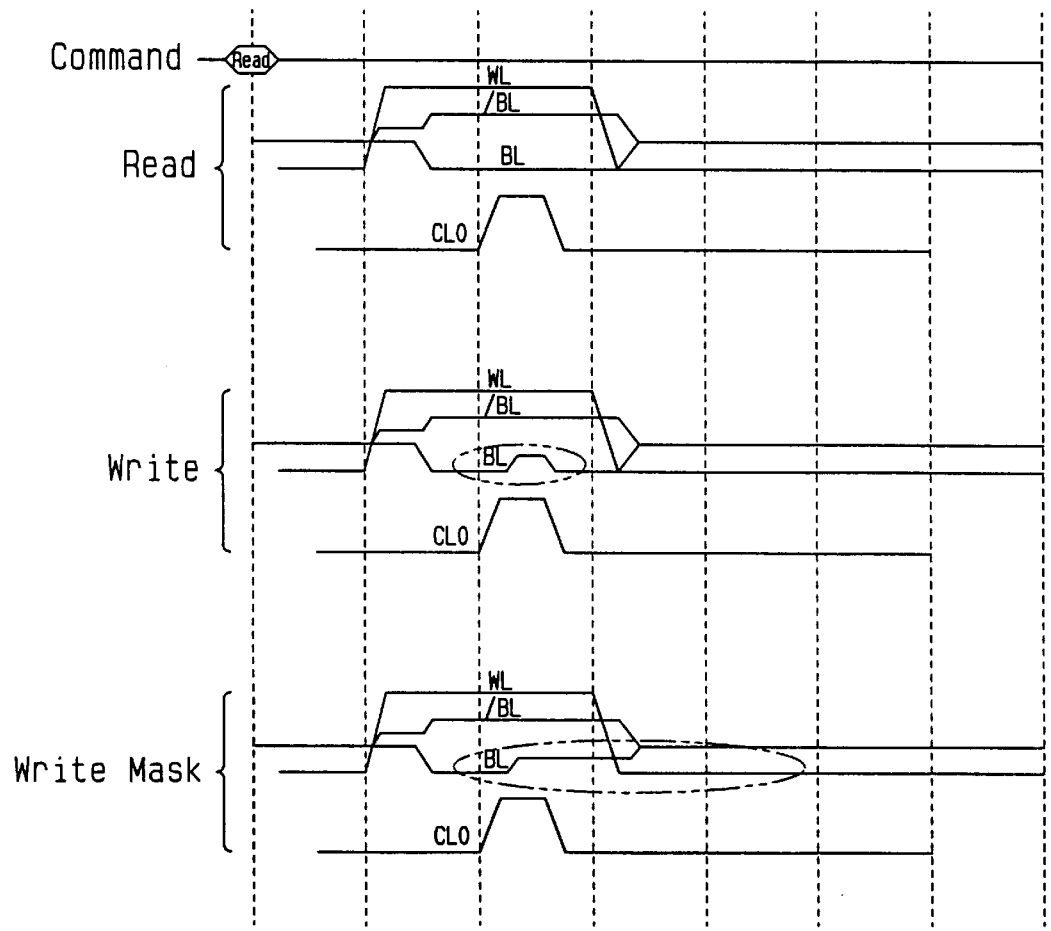
FIG. 4 is a timing chart of various signals appearing in the DRAM of FIG. 3.

Referring to FIGS. 5 to 8, a direct type DRAM according to one embodiment of the invention will be described principally dealing with distinctions over the DRAM 200 shown in FIG. 3. The DRAM of the present embodiment includes, in addition to the components illustrated in the DRAM 200 shown in FIG. 3, a column drive control circuit 10 connected to the column gates 101 to 104 and the transistor 107. The column drive circuit 10 turns off the column gates 101, 102 during the write mask operation by supplying a column select signal CL0 having a low level to the column gates 101, 102. In this manner, the data buses DB, /DB and the bit lines BL, /BL are electrically disconnected from each other, thus avoiding the occurrence of disturbances.

Figure 5:
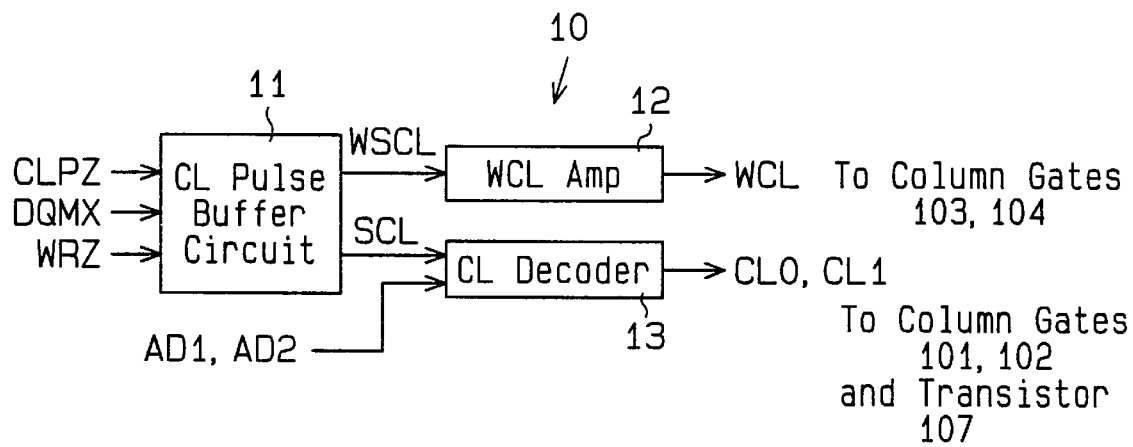
FIG. 5 is a schematic block diagram of a column gate drive control circuit according to one embodiment of the present invention.

As shown in FIG. 5, the column drive control circuit 10 comprises a column (CL) pulse buffer circuit 11, a write column (WCL) amp 12 and a column (CL) decoder 13. The WCL amp 12 and the CL decoder 13 are both connected to the CL pulse buffer circuit 11.

The CL pulse buffer circuit 11 receives a column (CL) pulse signal CLPZ, a mask signal DQMX and a write status signal WRZ from a circuit, not shown, within the DRAM, and feeds first and second column drive control signals SCL, WSCL to the CL decoder 13 and the WCL amp 12, 30 respectively. The signals CLPZ, DQMX and WRZ are generated within the DRAM on the basis of a command from a DRAM controller, not shown. The WCL amp 12 includes a pair of series connected inverter circuits, not shown. The WCL amplifier 12 receives the second column drive control signal WSCL from the CL pulse buffer circuit 11, and generates the write column signal WCL to feed the column gates 103, 104 (see FIG. 3). The CL decoder 13 receives the first column drive control signal SCL from the CL pulse buffer circuit 11 and first and second address data AD1, AD2, and generates column select signals CL0, CL1 to feed the column gates 101, 102 and the transistor 107.

The CL pulse signal CLPZ is used to determine the timing when each of the column gates 101 to 104 is turned on during the read operation, the write operation or the write mask operation. The CL pulse signal CLPZ rises to an H level when each of the column gates 101 to 104 is to be turned on, and falls to an L level when they are to be turned off. The mask signal DQMX is used to execute the write mask operation, and is set to an L level during the write mask operation, and to an H level during other operations. The write status signal WRZ is used to execute the write operation and the write mask operation, and is set to an H level during the write and the write mask operation and to an L level during other operations. In this embodiment, the write amp 112 (FIG. 3) activates during the write mask operation in response to the WRZ signal high. Alternatively, the write amp 112 may deactivate during the write mask operation.

The DRAM produces address data AD1, AD2 in accordance with column address data fed from an external controller. The address data AD1, AD2 are used to select either the column gates 101, 102 or other column gates, not shown, which are connected to an adjacent bit line pair. In the present embodiment, when both of the address data AD1, AD2 assume an H level, the column gates 101, 102 are selected. When the first address data AD1 assumes an L level and the second address data AD2 assumes an H level, the adjacent pair of column gates are selected. Whenever the first and second address data AD1, AD2 assume levels which are different from the described combinations, no column gate is selected.

Figure 6:
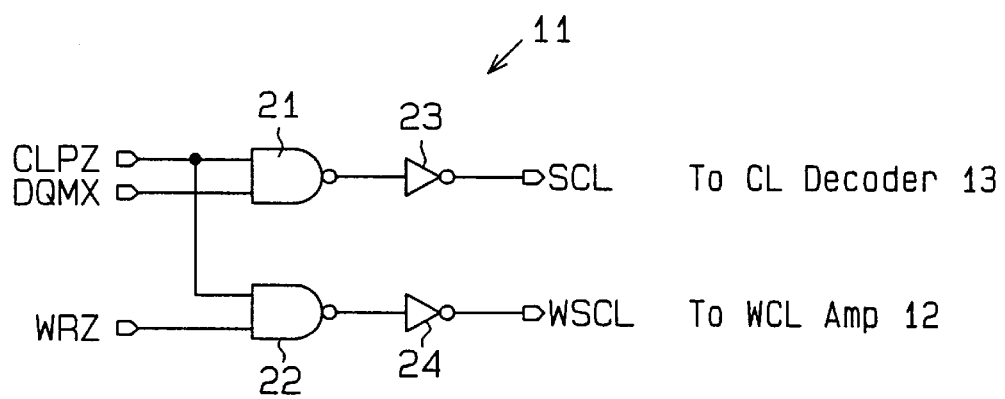
FIG. 6 is a schematic diagram of a CL pulse buffer circuit of FIG. 5.

Referring to FIG. 6, the CL pulse buffer circuit 11 will be described. The CL pulse buffer circuit 11 comprises first and second NAND circuits 21, 22 and first and second inverter circuits 23, 24. The first NAND circuit 21 receives the CL pulse signal CLPZ and the mask signal DQMX. When both of the CL pulse signal CLPZ and the mask signal DQMX assume an H level, the first NAND circuit 21 delivers an L level signal to the first inverter 23. In other words, the first NAND circuit 21 delivers an L level signal when the respective column gates 101, 102 and the transistor 107 are to be turned on during the read or the write operation. The first NAND circuit 21 delivers an H level signal to the inverter 23 during the write mask operation in response to the mask signal DQMX-low.

The first inverter circuit 23 receives the signal from the first NAND circuit 21, inverts it, and delivers the resulting signal to the CL decoder circuit 13 as the first column drive control signal SCL. Accordingly, the first column drive control signal SCL assumes an H level during the read or the write operation and assumes an L level during the write mask operation.

The second NAND circuit 22 receives the CL pulse signal CLPZ and the write status signal WRZ. When both of the CL pulse signal CLPZ and the write status signal WRZ assume an H level, the second NAND circuit 22 delivers an L level signal to the second inverter 24. In other words, the second NAND circuit 22 delivers an L level signal when the respective write column gates 103 and 104 are to be turned on during the write or the write mask operation. The second NAND circuit 22 delivers an H level signal to the inverter 24 during the read operation in response to write status signal WRZ-low.

The second inverter circuit 24 receives the signal from the second NAND circuit 22, inverts it, and delivers the resulting signal to the WCL amp 12 as the second column drive signal WSCL. Accordingly, the second column drive control signal WSCL assumes an H level during the write and write mask operations.

Figure 7:
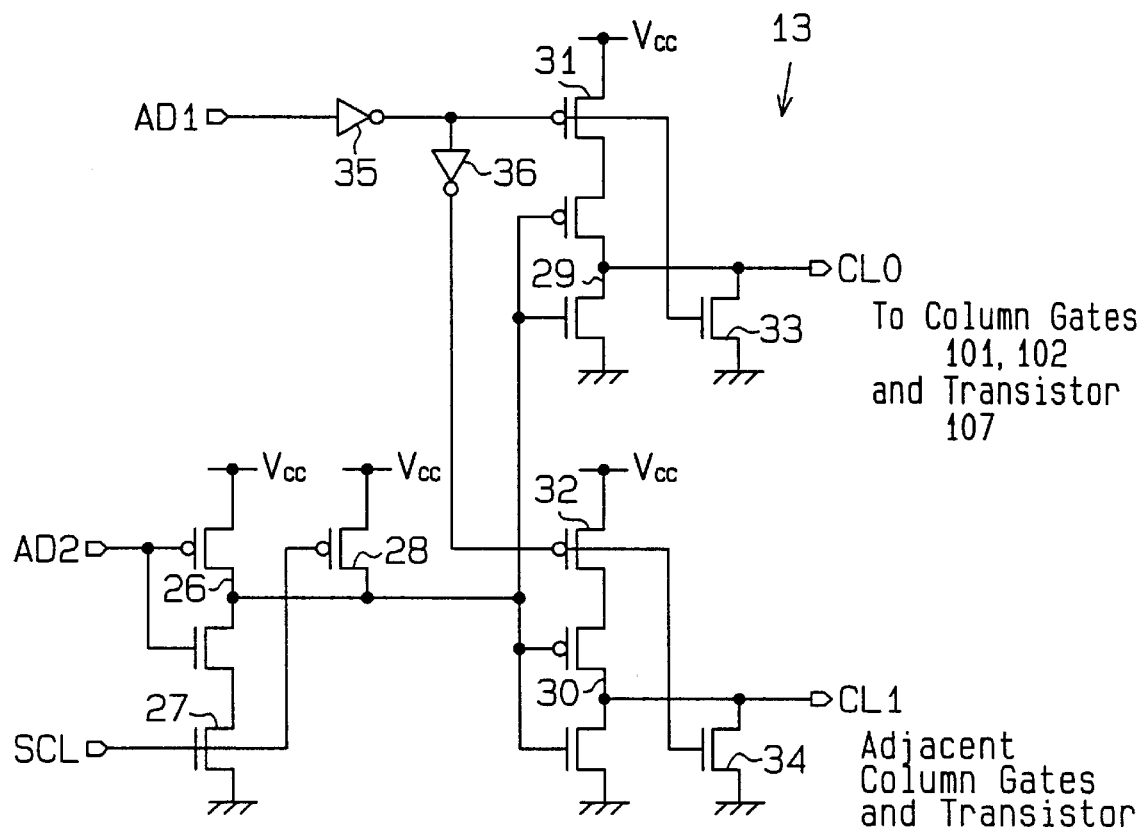
FIG. 7 is a circuit diagram of a CL decoder of FIG. 5.

The CL decoder 13 will be described with reference to FIG. 7. The CL decoder 13 comprises a first CMOS transistor circuit 26, and second and third CMOS transistor circuits 29, 30 connected to the first CMOS transistor circuit 26. The first CMOS transistor circuit 26 receives the second address data AD2. The first CMOS transistor circuit 26 is connected to the ground via an N-channel MOS transistor 27, which has a gate receiving the first column drive control signal SCL. When the first column drive control signal SCL is at its L level, the MOS transistor 27 is turned off, and the first CMOS transistor circuit 26 is deactivated. In contrast, when the first column drive control signal SCL assumes an H level, the MOS transistor 27 is turned on, and the first CMOS transistor circuit 26 is activated.

A P-channel MOS transistor 28 has a drain connected to the output terminal of the first CMOS transistor circuit 26, a source connected to a positive power supply Vcc, and a gate connected to the transistor 27 for receiving the first column drive control signal SCL. When the first column drive control signal SCL is at its L level, the MOS transistor 28 is turned on. At this time, the first CMOS transistor circuit 26 is deactivated. Accordingly, the positive supply Vcc is fed via the MOS transistor 28 to the output terminal of the CMOS transistor circuit 26, thus establishing an H level at the output terminal thereof. In contrast, when the first column drive control signal SCL assumes an H level, the MOS transistor 28 is turned off. At this time, the first CMOS transistor circuit 26 is activated, and accordingly, the first CMOS transistor circuit 26 delivers a signal having a level which represents an inversion of the level of the second address data AD2 at its output terminal.

Each of the second and the third CMOS transistor circuits 29, 30 is connected to the positive supply Vcc via a P-channel MOS transistor 31, 32, respectively. When the P-channel MOS transistors 31, 32 are turned on, the second and the third CMOS transistor circuits 29, 30 are activated. On the contrary, when the P-channel MOS transistors 31, 32 are turned off, the second and the third CMOS transistor circuits 29, 30 are deactivated.

The second CMOS transistor circuit 29 has an output terminal which is connected to the gates of the column gates 101, 102 and the transistor 107. When the column select signal CL0 from the second CMOS transistor circuit 29 is at its H level, the column gates 101, 102 and the transistor 107 are turned on. On the contrary, when the column select signal CL0 is at its L level, the column gates 101, 102 and the transistor 107 are turned off.

The third CMOS transistor circuit 30 has an output terminal which is connected to the gates of those column gates which are connected to the adjacent bit line pair and an associated transistor, both not shown. When the column select signal CL1 from the third CMOS transistor circuit 30 is at its H level, these column gates and the transistor are turned on. However, when the column select signal CL1 is at its L level, these column gates and transistors are turned off.

The output terminals of the second and third CMOS transistor circuits 29, 30 are connected to the ground via N-channel MOS transistors 33, 34, respectively. The P- and N-channel MOS transistors 32, 34 have their gates connected together, and the gate of the P-channel MOS transistor 32 is connected to the first address data AD1 via series connected inverter circuits 35, 36. Thus, both of the MOS transistors 32, 34 receive the first address data AD1. The P- and N-channel MOS transistors 31, 33 have their gates connected together, and are connected to the first address data AD1 via the inverter circuit 35. Thus, both of the MOS transistors 31, 33 receive an inversion of the first address data AD1. When the first CMOS transistor circuit 26 is activated, if the first and second address data AD1, AD2 both assume an H level, an H level is established for the column select signal CL0 and an L level is established for the column select signal CL1. Accordingly, both of the column gates 101, 102 are turned on in response to the column select signal CL0-high.

When the first CMOS transistor circuit 26 is activated, if the first address data AD1 assumes an L level and the second address data AD2 assumes an H level, an L level is established for the column select signal CL0 and an H level is established for the column select signal CL1. Accordingly, the adjacent column gates are turned on in response to the column select signal CL1-high.

When the first CMOS transistor circuit 26 is deactivated, or when the first column drive control signal SCL assumes an L level indicating the write mask operation, an L level is established for both of the column select signals CL0, CL1, independent of the levels of the first and second address data AD1, AD2. In other words, during the write mask operation, if the first and second address data AD1, AD2 have selected arbitrary column gates 101, 102, these column gates 101, 102 are turned off.

The operation of the DRAM of the present invention during the write mask operation will now be described. The CL pulse buffer circuit 11 determines whether the current operation is a write mask operation in accordance with the CL pulse signal CLPZ, the mask signal DQMX and the write status signal WRZ. If it is determined that the current operation is the write mask operation, the CL pulse buffer circuit 11 delivers the second column drive control signal WSCL-high to the WCL amp 12 and delivers the first column drive control signal SCL-low to the CL decoder 13. Accordingly, the WCL amp 12 delivers the column select signal WCL-high in response to the second column drive control signal WSCL-high. The CL decoder 13 delivers the column select signals CL0, CL1-low in response to the first column drive control signal SCL-low.

Referring to FIG. 3 again, the column gates 103, 104 are turned on in response to the column select signal WCL-high and the column gates 101, 102 and the MOS transistor 107 are turned off in response to the column select signal CL0-low. Accordingly, because the column gates 101, 102 are turned off, the data buses DB, /DB are not connected with the bit lines BL, /BL. At this time, the data buses DB, /DB remain floating, and data representing the H level on the data buses DB, /DB is electrically disconnected from the bit lines BL, /BL which are subject to the write mask operation. As a consequence, the sense amp 100 can reliably receive data from the memory cell 110 if the turn-on of the column gates 101, 103 and the activation of the sense-amp 100 occurs substantially simultaneously.

Figure 8:
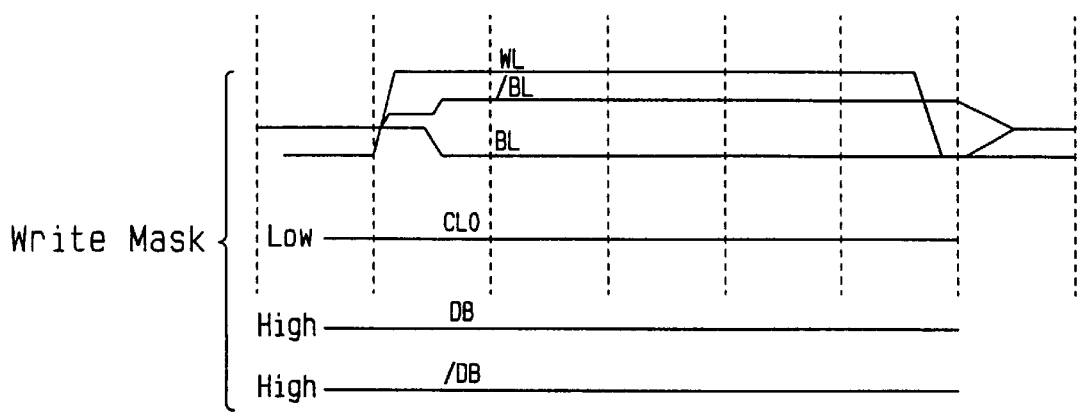
FIG. 8 is a timing chart of various signals appearing in the DRAM according to the present invention.

Because the bit lines BL, /BL are not connected to the data buses DB, /DB, there is no load variation of the sense-amp 100. Thus, as shown in FIG. 8, no disturbance is caused to data on the bit lines BL, /BL. Consequently, an erroneous rewriting of data into the memory cell 110 is prevented during the write mask operation, allowing correct data to be maintained in the memory cell 110 in the same manner as during the normal read operation.

Since the DRAM of the present embodiment is of the direct sensing type, it is capable of delivering any desired number of data bits in parallel. Subsequent to the data delivery, the automatic precharge is executed, thus bringing forth an advantage that an activation interval of the sense-amp 100 is reduced.

It should be understood that instead of the DRAM, the invention may be embodied in any semiconductor memory provided with the write mask function as in a synchronous RAM such as SDRAM.

During the write mask operation, the column gates 101, 102 or/and 103, 104 may be turned off. In such instance, the WCL amp 12 is modified to deliver the column select signal WCL having a low level during the write mask operation. Alternatively, a circuit may be separately provided which produces a column select signal WCL which turns off the column gates 103, 104 during the write mask operation in accordance with the logic of the column select signal CL0 and the first column drive control signal SCL.

Therefore, the present examples and embodiments are to be considered as illustrative and not restrictive and the invention is not to be limited to the details given herein, but may be modified within the scope and equivalence of the appended claims.

What is claimed is:

1. A semiconductor memory comprising:
    a plurality of memory cells;
    a bit line pair connected to the memory cells;
    a column gate pair connected to the bit line pair;
    a data bus pair connected to the bit line pair via the column gate pair; and
    a column gate drive control circuit receiving a write mask signal and outputting a gate control signal to the column gate pair, the column gate drive control circuit turning the column gate pair off in response to the write mask signal.

2. The semiconductor memory according to claim 1, wherein the column gate pair includes first and second column gate pairs connected in series between the bit line pair and the data bus pair, wherein the column gate drive control circuit turns off the first column gate pair during a write mask operation and turns on the second column gate pair during the write mask operation.

3. The semiconductor memory according to claim 2, wherein the column gate drive control circuit includes:
    a column pulse buffer circuit for receiving the write mask signal and generating a first column drive control signal; and
    a column decoder, connected to the column pulse buffer circuit and the first column gate pair, for receiving the first column drive control signal from the column pulse buffer circuit and address data specifying a memory cell, and for generating a first column select signal which turns off the first column gate pair corresponding to the first column drive control signal.

4. The semiconductor memory according to claim 3, wherein the column pulse buffer circuit determines whether the write mask signal indicates a write operation or the write mask operation and generates a second column drive control signal, the column gate drive control circuit further comprising:

a write column amp connected to the column pulse buffer circuit and the second column gate pair for receiving the second column drive control signal from the column pulse buffer circuit and for generating a second column select signal which turns on the second column gate pair.

5. The semiconductor memory according to claim 2, further comprising a sense-amp connected across the bit line pair.

6. The semiconductor memory according to claim 2, wherein the bit line pair includes first and second bit lines, and the data bus pair includes first and second data buses connected to the first and second bit lines, respectively, the memory further comprising:

a first MOS transistor having a gate connected to the first bit line, a drain connected to the second data bus and a source connected to a ground potential; and a second MOS transistor having a gate connected to the second bit line, a drain connected to the first data bus and a source connected to the ground potential.

7. The semiconductor memory according to claim 1, wherein the column gate pair includes a first column gate pair connected to the data bus pair, and a second column gate pair connected between the first column gate pair and the bit line pair, wherein the column gate drive control circuit turns off the first column gate pair during a write mask operation and turns on the second column gate pair during a write operation and/or during the write mask operation.

8. The semiconductor memory according to claim 1, further comprising a sense-amp connected across the bit line pair, wherein the sense-amp rewrites data in the memory cell when the column gate pair is turned off.

9. A method of controlling a semiconductor memory including a plurality of memory cells, a bit line pair connected to the memory cells, a data bus pair, and a column gate pair connected between the bit line pair and the data bus pair, the method comprising the steps of:

detecting a write mask operation; and turning the column gate pair off during the write mask operation.

10. The method according to claim 9, further comprising the step of receiving a mask signal indicating an operation of the memory before the detecting step.

11. The method according to claim 10, wherein the column gate pair includes first and second column gate pairs connected in series, the method further comprising the steps of:

turning off the first column gate pair during the write mask operation; and turning on the second column gate pair during the write mask operation.

12. The method according to claim 11, further comprising the steps of:

turning both the first and second column gate pairs on when the mask signal indicates a normal write operation; and writing data into one of the plurality of memory cells from the data bus pair via the bit line pair.

13. The method according to claim 11, wherein the bit line pair includes first and second bit lines, and the data bus pair includes first and second data buses connected to the first and second bit lines, respectively, the memory includes a first MOS transistor having a gate connected to the first bit line, a drain connected to the second data bus and a source connected to a ground potential and a second MOS transistor having a gate connected to the second bit line, a drain connected to the first data bus and a source connected to the ground potential, the method further comprising the steps of:

disconnecting the bit line pair from the data bus pair when the mask signal indicates the write mask operation by turning off the first column gate pair during the write mask operation;

reading data on the first bit line to the second data bus via the first MOS transistor; and reading data on the second bit line to the first data bus via the second MOS transistor.

14. The method according to claim 9, further comprising the step of setting a high level on both of the buses of the data bus pair.

\* \* \* \* \*